United States Patent
Choi et al.

(10) Patent No.: US 9,812,372 B2
(45) Date of Patent: Nov. 7, 2017

(54) ELECTROSTATIC CHUCK ASSEMBLY, SEMICONDUCTOR MANUFACTURING APPARATUS HAVING THE SAME, AND METHOD OF MEASURING TEMPERATURE OF ELECTROSTATIC CHUCK

(71) Applicant: SAMSUNG ELECTRONICS CO., LTD., Suwon-si, Gyeonggi-do (KR)

(72) Inventors: Youn Sok Choi, Seoul (KR); Jeong Hyoun Sung, Suwon-si (KR); Sang Yoon Soh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/232,151

(22) Filed: Aug. 9, 2016

(65) Prior Publication Data
US 2017/0178978 A1 Jun. 22, 2017

(30) Foreign Application Priority Data

Dec. 18, 2015 (KR) .......................... 10-2015-0182154

(51) Int. Cl.
*H01L 21/66* (2006.01)
*H01L 21/683* (2006.01)

(52) U.S. Cl.
CPC .......... *H01L 22/12* (2013.01); *H01L 21/6833* (2013.01)

(58) Field of Classification Search
CPC . H01L 21/6831; H01L 21/6833; H01L 22/12; G01R 21/06; G01R 21/133; G01R 29/04; G01R 29/08
See application file for complete search history.

(56) References Cited

U.S. PATENT DOCUMENTS 5,667,622 A * 9/1997 Hasegawa ......... H01L 21/67103
156/345.27
5,996,353 A * 12/1999 Maxwell ............... B01D 5/0042
62/259.2
6,495,802 B1 12/2002 Maltabes et al.
(Continued)

FOREIGN PATENT DOCUMENTS

JP 2001-228027 A 8/2001
JP 2002-071323 A 3/2002
(Continued)

*Primary Examiner* — Caridad Everhart
(74) *Attorney, Agent, or Firm* — Lee & Morse, P.C.

(57) ABSTRACT

An electrostatic chuck assembly includes a reference temperature sensor, a measurement zone temperature sensor, and a measurement zone temperature calculator. The reference temperature sensor measures a reference temperature of the electrostatic chuck. The measurement zone temperature sensor is spaced from the reference temperature sensor on the electrostatic chuck and senses temperature signals of a plurality measurement zones of the electrostatic chuck. The measurement zone temperature calculator calculates a temperature of each of the measurement zones by setting a measurement range within a temperature range, previously determined based on the reference temperature measured by the reference temperature sensor, and measures the temperature signal of each of the measurement zones sensed by the measurement zone temperature sensor within the measurement range.

20 Claims, 9 Drawing Sheets

(56) References Cited

U.S. PATENT DOCUMENTS

| | | | |
|---|---|---|---|
| 7,297,894 B1 * | 11/2007 | Tsukamoto | H01L 21/67109 118/724 |
| 7,921,802 B2 | 4/2011 | De Boer | |
| 8,791,392 B2 | 7/2014 | Singh | |
| 8,986,494 B2 | 3/2015 | Matsudo et al. | |
| 2015/0170977 A1 | 6/2015 | Singh | |

FOREIGN PATENT DOCUMENTS

| | | |
|---|---|---|
| JP | 2004-219263 A | 8/2004 |
| JP | 2009-236631 A | 10/2009 |
| JP | 2009-258007 A | 11/2009 |

* cited by examiner

ELECTROSTATIC CHUCK ASSEMBLY, SEMICONDUCTOR MANUFACTURING APPARATUS HAVING THE SAME, AND METHOD OF MEASURING TEMPERATURE OF ELECTROSTATIC CHUCK

CROSS-REFERENCE TO RELATED APPLICATION

Korean Patent Application No. 10-2015-0182154, filed on Dec. 18, 2015, and entitled, "Electrostatic Chuck Assembly, Semiconductor Manufacturing Apparatus Having the Same, and Method of Measuring Temperature of Electrostatic Chuck," is incorporated by reference herein in its entirety.

BACKGROUND

1. Field

One or more embodiments described herein relate to an electrostatic chuck assembly, a semiconductor manufacturing apparatus having an electrostatic chuck assembly, and a method for measuring the temperature of an electrostatic chuck.

2. Description of the Related Art

Semiconductor, display, and other integrated circuit devices are manufactured by performing various processes (e.g., deposition, etch, photolithography, ion injection processes) on a substrate or other object. A semiconductor etch process may be performed by an apparatus which includes a gas supply unit connected to a process chamber. The gas supply unit provides a process gas to the process chamber for etching a substrate, which is held in position by an electrostatic chuck (ESC).

During this process, a temperature difference may be occur at various locations of the substrate. This temperature difference may degrade the quality of the integrated circuit device.

In an attempt to address this issue, a sensor may measure the temperature of the ESC or substrate. Various control operations may then be performed to reduce the temperature difference. However, when the sensor is installed at one or a few positions on the ESC, the temperature differences at various regions of the ESC may not be accurately measured. For example, when the number of temperature sensors is relatively few, the measured temperature may not represent the temperature of the ESC or substrate. Thus, a temperature distribution defect in the ESC may not be detected. Accordingly, accurate temperature control of the ESC or substrate is difficult.

Another approach involves measuring temperature in multiple zones of an ESC and performing temperature control of individual zones based on the temperature measurement. The temperature measurement of an individual zone may be used as a basis for controlling the temperature of each zone of the ESC. However, the number of temperature sensors increases linearly with the number of individual zones. This increase may add cost and complexity to the process as well as threaten the reliability of the ESC.

In an attempt solve this problem, a method for applying a temperature sensor to a single optical fiber has been proposed in order to measure temperatures at a plurality of positions. One example of such a sensor is a fiber Bragg grating (FBG) sensor. However, increases in the temperature measurement range of the sensor may produce a wide wavelength range for measuring temperature. Consequently, a certain distance must exist between measured wavelengths in an attempt to remove interference between neighboring wavelengths.

When this distance is not secured, interference may make it difficult to check which wavelength is a temperature signal at a corresponding position to be measured. This distance may also reduce the number of FBGs that is able to be provided on a single optical fiber. Thus, a large number of optical fibers may be used to measure temperature at one or various positions, which increases costs and complexity and degrades reliability.

SUMMARY

In accordance with one or more embodiments, an electrostatic chuck assembly includes an electrostatic chuck to support a substrate using electrostatic force, the electrostatic chuck including a plurality of measurement zones divided by a plurality of partition lines; a reference temperature sensor coupled to the electrostatic chuck to measure a reference temperature of the electrostatic chuck; a measurement zone temperature sensor coupled to the electrostatic chuck and spaced from the reference temperature sensor, the measurement zone temperature sensor to sense measurement zone temperature signals of the measurement zones; and a measurement zone temperature calculator to calculate a temperature of each of the measurement zones by setting a measurement range within a temperature range previously determined based on the reference temperature measured by the reference temperature sensor, and to measure the measurement zone temperature signal of each of the measurement zones sensed by the measurement zone temperature sensor within the measurement range.

In accordance with one or more other embodiments, a semiconductor manufacturing apparatus includes a process chamber including a space for a semiconductor manufacturing process; and an electrostatic chuck assembly to support a substrate using electrostatic force, wherein the electrostatic chuck assembly includes: an electrostatic chuck to support the substrate using the electrostatic force and including a plurality of measurement zones divided by a plurality of partition lines; a reference temperature sensor coupled to the electrostatic chuck to measure a reference temperature of the electrostatic chuck; a measurement zone temperature sensor coupled to the electrostatic chuck and spaced from the reference temperature sensor, the measurement zone temperature sensor to sense measurement zone temperature signals of the measurement zones; and a measurement zone temperature calculator to calculate a temperature of each of the measurement zones by setting a measurement range within a temperature range previously determined based on the reference temperature measured by the reference temperature sensor and measuring the measurement zone temperature signal sensed by the measurement zone temperature sensor within the measurement range.

In accordance with one or more other embodiments, a method for measuring temperature of an electrostatic chuck, the method comprising: measuring a reference temperature of an electrostatic chuck using a reference temperature sensor, the reference temperature sensor coupled to the electrostatic chuck to support a substrate using electrostatic force; sensing a measurement zone temperature signal of a plurality of measurement zones divided by a plurality of partition lines in the electrostatic chuck, the measurement zone temperature signal sensed using a measurement zone temperature sensor coupled to the electrostatic chuck and spaced from the reference temperature sensor; setting a measurement range within a temperature range previously determined based on the reference temperature; and calculating a temperature of each of the measurement zones by setting a measurement range within a temperature range previously determined based on the reference temperature and measuring the measurement zone temperature signal sensed by the measurement zone temperature sensor within the measurement range.

In accordance with one or more other embodiments, an apparatus includes a first sensor to measure a reference temperature at a predetermined location of an electrostatic chuck; and a second sensor to generate temperature signals for different zones of the electrostatic chuck, wherein the second sensor includes a plurality of sensing areas along an optical fiber which is to carry light in a predetermined wavelength range and wherein the sensing areas are to generate the temperature signals.

BRIEF DESCRIPTION OF THE DRAWINGS

Features will become apparent to those of skill in the art by describing in detail exemplary embodiments with reference to the attached drawings in which.

DETAILED DESCRIPTION

An electrostatic chuck assembly and a method of measuring a temperature of an electrostatic chuck according to an embodiment may be applied to various semiconductor manufacturing apparatuses. However, in the following description, for convenience of explanation, only a case of a semiconductor dry etching apparatus among semiconductor manufacturing apparatuses is described.

Figure 1:
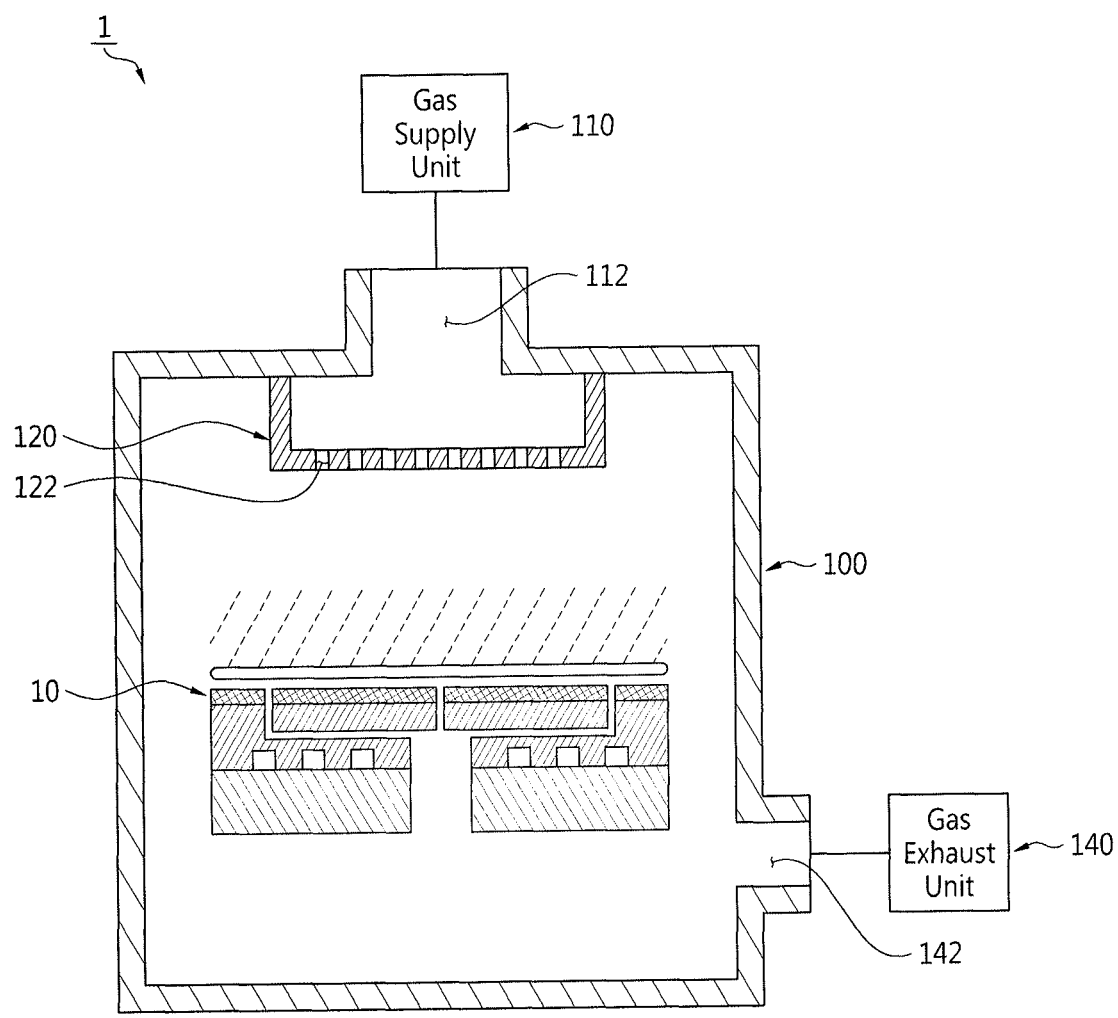
FIG. 1 illustrates an embodiment of a semiconductor dry etching apparatus that includes an electrostatic chuck assembly.

FIG. 1 illustrates a cross-sectional view of an embodiment of a semiconductor dry etching apparatus 1 which includes an electrostatic chuck assembly 10, a process chamber 100, a gas supply unit 110, a nozzle 120, an upper electrode, the electrostatic chuck assembly 10, and a gas exhaust unit 140.

The process chamber 100 may include a gas inlet 112 and a gas outlet 142. The gas inlet 112 is at an upper portion of the process chamber 100. The gas outlet 142 is at a side portion of the process chamber 100.

The gas supply unit 110 is connected to the gas inlet 112 of the process chamber 100. The gas supply unit 110 supplies an etching gas, that is a process gas, to the inside of the process chamber 100 through the gas inlet 112.

The nozzle 120 is connected to the gas inlet 112 and has a plurality of nozzle holes 122 for injecting the etching gas.

The upper electrode is arranged in the upper portion in the process chamber 100. The upper electrode is arranged to surround the nozzle 120. RF power for forming plasma may be applied to the upper electrode.

The gas exhaust unit 140 is connected to the gas outlet 142 and a non-reactive etching gas and by-products of etching are exhausted to a location outside of the process chamber 100 through the gas exhaust unit 140.

The electrostatic chuck assembly 10 may be provided at a lower portion of the process chamber 100. The electrostatic chuck assembly 10 forms plasma from the etching gas with the upper electrode.

Figure 2:
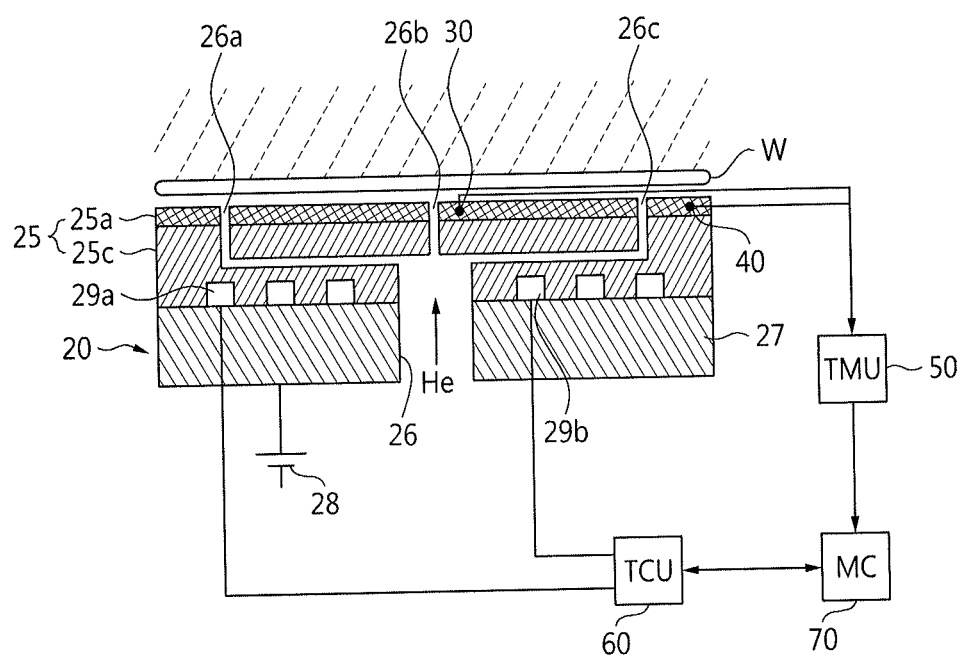
FIG. 2 illustrates an embodiment of the electrostatic chuck assembly.
Figure 3:
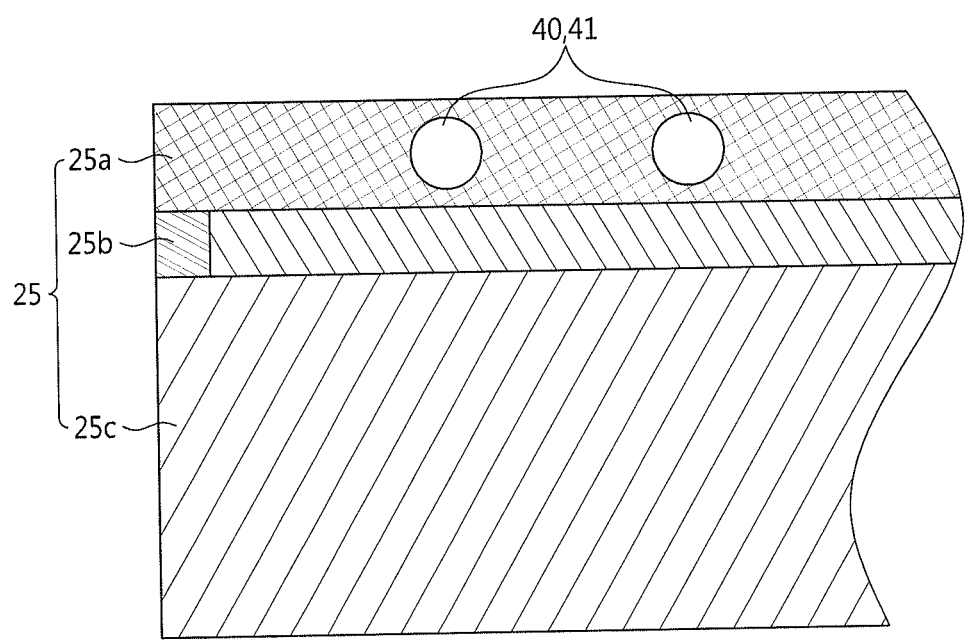
FIG. 3 illustrates an embodiment of an electrostatic chuck.
Figure 4:
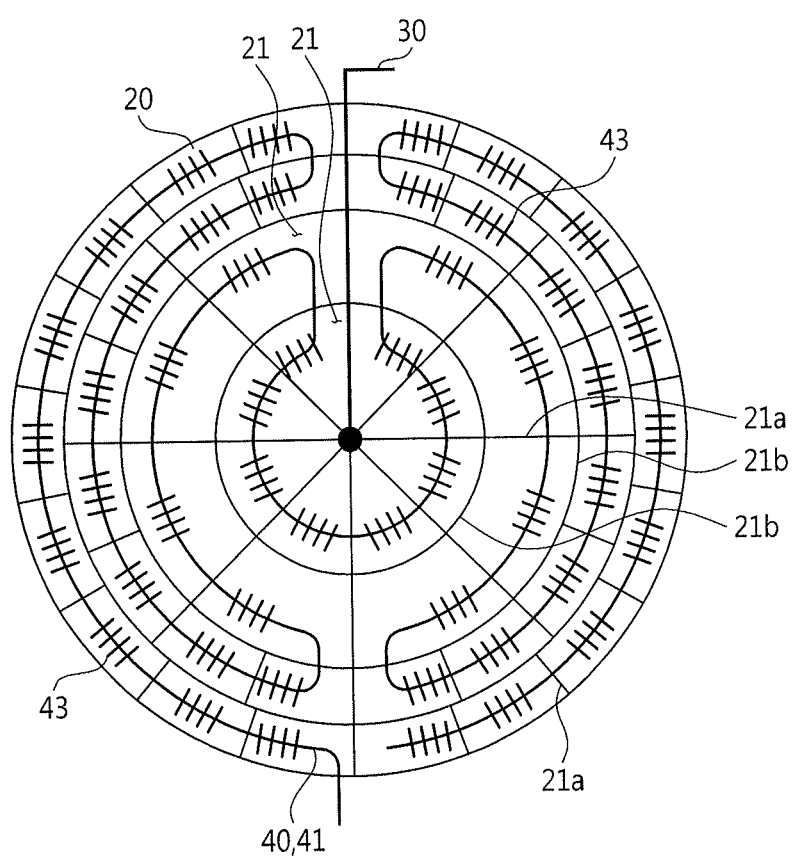
FIG. 4 illustrates another view of the electrostatic chuck.
Figure 5:
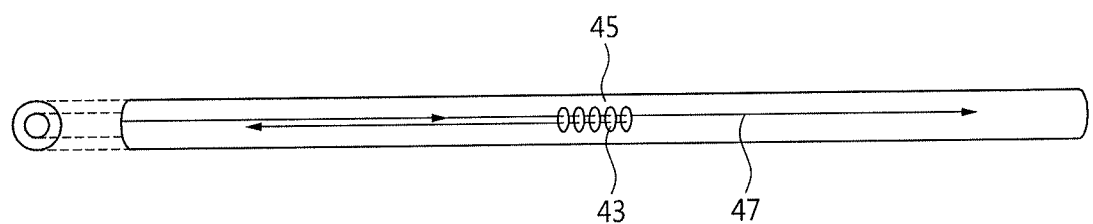
FIG. 5 illustrates an embodiment of an optical fiber including a fiber Bragg grating (FBG)

FIG. 2 illustrates a cross-sectional view of an embodiment of the electrostatic chuck assembly 10. FIG. 3 illustrates a cross-sectional view of an embodiment of an electrostatic chuck 20 of the electrostatic chuck assembly 10. FIG. 4 illustrates another view of the electrostatic chuck 20. FIG. 5 illustrates an embodiment of an optical fiber including a fiber Bragg grating (FBG) sensor. FIG. 6 illustrates an example of how the FBG temperature sensor may measure temperature.

Referring to FIGS. 2 to 6, the electrostatic chuck assembly 10 may include the electrostatic chuck 20, a reference temperature sensor unit 30, a measurement zone temperature sensor unit 40, a measurement zone temperature measuring unit (TMU) 50, a temperature control unit 60 (TCU), and a main controller (MC) 70.

The electrostatic chuck 20 may include an electrode cap 25 and an electrode 27. The electrode cap 25 may include an upper ceramic dielectric layer 25a, a bonding layer 25b, and a metal body 25c. The electrode 27 receives direct voltage from a power source 28. When plasma is formed over the entire surface of a substrate W, the temperature of the substrate W increases to a high temperature, causing a process defect. To reduce the temperature of the substrate W, channels 26, 26a, 26b, and 26c supply a gas (e.g., helium He) toward a rear surface of the substrate W. The helium is supplied to the rear surface of the substrate W via the channels 26, 26a, 26b, and 26c.

The electrostatic chuck 20 includes channels 29a and 29b that provide a circulation path of a coolant for cooling the electrode cap 25. The coolant passing through the channel 29a circulates inside the electrode cap 25 and then is exhausted through the channel 29b. The temperature of the coolant exhausted from the channel 29b is controlled by the temperature control unit 60, e.g., a chiller. Then, the coolant is re-supplied to the channel 29a. The coolant temperature control by the temperature control unit 60 is controlled by the main controller 70. The main controller 70 receives information relating to the temperatures of a plurality of measurement zones 21 of the electrostatic chuck 20 from the measurement zone temperature measuring unit 50, that calculates the temperatures of the measurement zones 21.

The measurement zones 21 may be divided by a plurality of partition lines, for example, as illustrated in FIG. 4. In the present embodiment, the measurement zones 21 are sectioned by a plurality of lines 21a radially arranged from a center of the electrostatic chuck 20 and a plurality of circles 21b spaced apart from each other in a direction in which diameter increases toward the outside along a radial line. In the present embodiment, the number of outer sections is greater than the number of inner sections. Accordingly, the number of the measurement zones 21 in the same circumferential direction increases from the center towards the outside.

In the present embodiment, the reference temperature sensor unit 30 is in a central area of the electrostatic chuck 20. For example, the reference temperature sensor unit 30 is arranged to be spaced apart from the measurement zone temperature sensor unit 40 and is located in the central area of the electrostatic chuck 20 on a plane of the electrostatic chuck 20. In the present embodiment, the reference temperature sensor unit 30 arranged in the central area on the plane of the electrostatic chuck 20 measures temperature at one position of the electrostatic chuck 20. In another embodiment, the reference temperature sensor unit 30 may be at a predetermined single position of the electrostatic chuck 20 or at a plurality of predetermined positions.

The reference temperature sensor unit 30 may be, for example, a thermocouple temperature sensor, a resistance temperature detector (RTD) temperature sensor, or an optical fiber temperature sensor. In a thermocouple temperature sensor, opposite ends of two types of metal conductive bodies are electrically connected. When a temperature difference develops at opposite ends, current flows on a circuit (Zeeback effect). The temperature of one end (e.g., reference contact point) is maintained at a certain temperature (e.g., fundamentally at 0° C.) and the value of a thermoelectromotive force is measured. As a result, the temperature of the other end (e.g., temperature contact point) may be determined. In an RTD temperature sensor, resistance values vary according to a temperature. In optical fiber temperature sensor, a temperature change in an external object is measured based on one or more characteristics of light, e.g., phase, strength, polarization, scattering, and/or absorption.

The measurement zone temperature sensor unit 40 is coupled to the electrostatic chuck 20 and generates a measurement zone temperature signal of the measurement zones 21. The measurement zone temperature sensor unit 40 may include a measurement zone temperature sensor 41 that senses temperatures at different positions according to one or more parameters of light entering and exiting an optical fiber, a light source that transmits a wavelength of a certain band range to each of the measurement zones 21 via the optical fiber, and a photodetector that receives a light wavelength.

In the present embodiment, the measurement zone temperature sensor 41 is an FBG temperature sensor 41 which includes a plurality of FBGs 43 placed along the length of the optical fiber.

As illustrated in FIG. 5, the optical fiber of the FBG temperature sensor 41 may include a cladding 45, a core 47, and the FBGs 43 in the core 47. In the present embodiment, the optical fiber of the FBG temperature sensor 41 may be inserted in and installed at at least one of the upper ceramic 25a or the bonding layer 25b, at least one of which corresponds to a dielectric layer of the electrostatic chuck 20. In the another embodiment, the FBG temperature sensor 41 may be inserted in and installed only at the bonding layer 25b or at both the upper ceramic 25a and bonding layer 25b.

Also, in the present embodiment, the FBGs 43 are arranged corresponding to the measurement zones 21, e.g., each of the FBGs 43 is arranged in a respective one of the measurement zones 21.

Figure 6A:
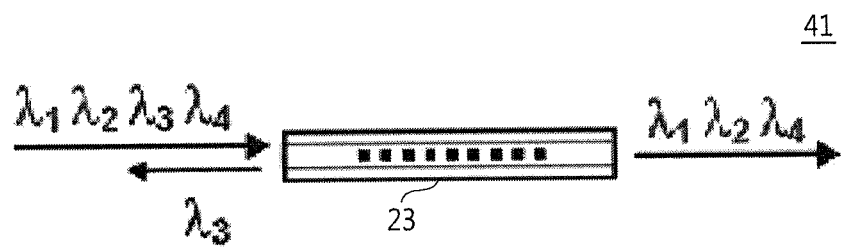
FIGS. 6A and 6B illustrate an example of how temperature may be measured using an FBG temperature sensor.
Figure 6B:
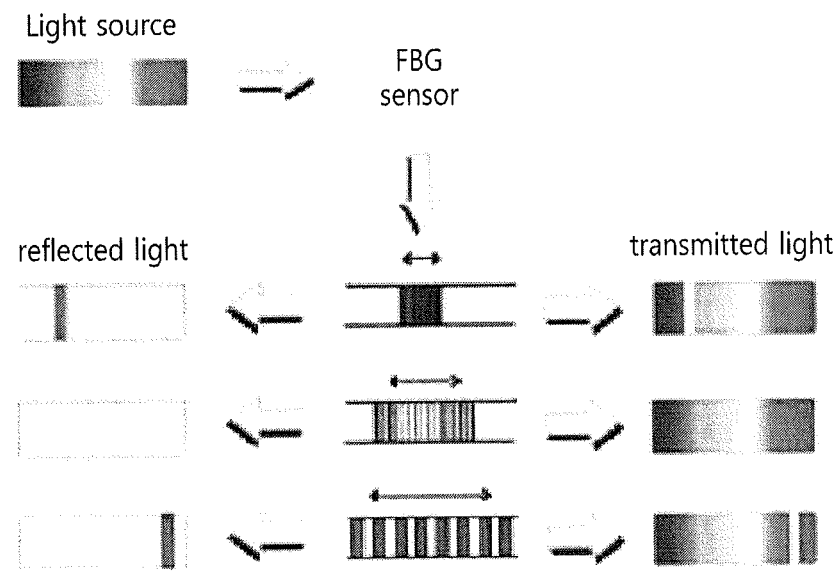

FIGS. 6A and 6B illustrate an example of how the FBG temperature sensor 41 may measure temperature. Referring to FIG. 6A, Bragg gratings are marked on an optical fiber 23 along a predetermined length. The wavelength of light reflected from each grating varies according to a change in external conditions, such as temperature and strength. Thus, the gratings characteristically reflect only a wavelength satisfying a Bragg condition and transits the other wavelengths. In this state, when the surrounding temperature of the gratings changes or tension is applied to the gratings, a refractive index or length of the optical fiber changed. As a result, a shift in the wavelength of the reflected light occurs.

Temperature, tension, pressure, or bending may be detected by measuring the amount of the wavelength shift of reflected light from the FBGs. For example, as illustrated in FIG. 6A, when light sources $\lambda 1$, $\lambda 2$, $\lambda 3$, and $\lambda 4$ having wide wavelength bands are incident on the FBG temperature sensor, only light having a particular wavelength $\lambda 3$ of the incident wavelength bands is reflected, according to the gratings previously formed in the FBG temperature sensor 41. The other wavelengths $\lambda 1$, $\lambda 2$, and $\lambda 4$ are transmitted.

The wavelength of the reflected light is shifted as the interval of the gratings in the FBG temperature sensor 41 changes, as illustrated in FIG. 6B. The change in the interval between the gratings (e.g., strain) may be produced from the wavelength shift. Since strain is a function of a temperature, the temperature at the position of each of the FBGs 43 may be calculated from the strain calculated from the shift of the reflected wavelength.

Accordingly, as the FBGs 43 (that reflect only the wavelength of a particular band) are serially connected on a single optical fiber and wavelengths of light reflected from the respective FBGs 43 are changed to be different from one another, measurement of temperatures in areas where the FBGs 43 are located may be simultaneously performed.

As described above, in the present embodiment, since the FBGs 43 are arranged corresponding to the measurement zones 21, the shift of the wavelength reflected from the FBGs 43 of each of the measurement zones 21 may be recognized. Thus, a temperature signal from FBGs 43 of each of the measurement zones 21 (e.g., reverberant wavelength) may be detected in accordance with the present embodiment.

In the present embodiment, the FBGs 43 may be relatively densely connected to a single optical fiber 23 in series. This is because, in the present embodiment, even when the FBGs 43 are densely and serially connected to a single optical fiber 23, the wavelength reflected from the FBGs 43 of each of the measurement zones 21 may be measured and calculated by the measurement zone temperature measuring unit 50 based on a reference temperature measured by the reference temperature sensor unit 30, as described in greater detail below.

The light source transmits a wavelength of a certain band range to the FBGs 43 of each of the measurement zones 21 via the optical fiber. The photodetector receives a reflected wavelength of light. Time division multiplexing TDM may be used, for example, to distinguish different optical signals with respect to each of the FBGs 43.

The detected temperature signal of the measurement zones 21 (e.g., the reverberant wavelength) may be used to calculate temperature by the measurement zone temperature measuring unit 50. For example, when the light source transmits a wavelength of a certain band range to each of the FBGs 43 (which are serially arranged spaced apart from one another) through the optical fiber, each of the FBGs 43 reflects only a previously set particular wavelength and transmits all the other wavelengths.

Each of the FBGs 43 causes deformation of a Bragg grating in response to the temperature of a zone of the measurement zones 21 where the FBG 43 is located. Accordingly, the wavelength reflected from each of the FBGs 43 is shifted by a value corresponding to the deformation rate.

The measurement zone temperature measuring unit 50 measures and calculates the amount of shift of the wavelength reflected from each of the FBGs 43 and determines the amount as a temperature. The measurement zone temperature measuring unit 50 may receive input of a signal about the reference temperature of the electrostatic chuck 20 from the reference temperature sensor unit 30 and may use the reference temperature.

For example, the measurement zone temperature measuring unit 50 may set a measurement range to be within a temperature range previously determined based on the reference temperature measured by the reference temperature sensor unit 30. The measurement zone temperature measuring unit 50 may then measure and calculate the amount of shift of the wavelength detected by the measurement zone temperature sensor unit 40 within the measurement range, thereby providing an indication of the temperature of each measurement zone of the measurement zones 21 where each of the FBGs 43 is located.

In the present embodiment, a wavelength range corresponding to a temperature range is obtained by adding a previously prepared temperature deviation of the electrostatic chuck 20 to the reference temperature measured by reference temperature sensor unit 30. The temperature of a measurement zone of the measurement zones 21, where each of the FBGs 43 is located, is produced by measuring a signal within the wavelength range.

For example, consider the case where the reference temperature is 80° C. and the deviation is 10° C. A temperature range corresponding to 70° C. to 90° C. is therefore set to be the measurement range. Thus, the temperature of the measurement zone may be measured by measuring and calculating a signal in the wavelength range corresponding to the temperature range.

According to another approach, a wide wavelength range is achieved by increasing the measurement temperature range. When a wide wavelength range is secured, if sufficient distance between the measured wavelengths is not secured, interference between neighboring wavelengths may occur. Accordingly, if FBGs are serially connected to a single optical fiber, a certain separation distance between adjacent ones of the FBGs must exist. This, in turn, may limit the number of the FBGs 43 that can be serially connected to a single optical fiber.

In accordance with the present embodiment, a comparatively greater number of FBGs 43 may be serially connected to a single optical fiber. The reference temperature may be measured using the reference temperature sensor unit 30, and a temperature range may be obtained by adding a temperature deviation of the electrostatic chuck 20 to the reference temperature that is inversely calculated as a wavelength range. A reverberant wavelength may then be sensed as an inversely calculated wavelength range (e.g., a peak value) so that the temperature of each measurement zone of the measurement zones 21 may be detected where each of the FBGs 43 is located. Accordingly, even when the FBGs 43 are relatively densely provided and serially connected to a single optical fiber (e.g., even when interference between neighboring wavelengths may be generated), the temperature of each of the measurement zones 21 may be accurately measured.

Moreover, even when the FBGs 43 are relatively densely and serially connected to a single optical fiber, the temperature of each of the measurement zones 21 may be measured. In this case, the number of optical fibers to measure the temperature of the electrostatic chuck 20 may be reduced. Thus the structure of the electrostatic chuck 20 may be simplified. When the structure of the electrostatic chuck 20 is simplified, reliability of the electrostatic chuck 20 may be improved.

Figure 7:
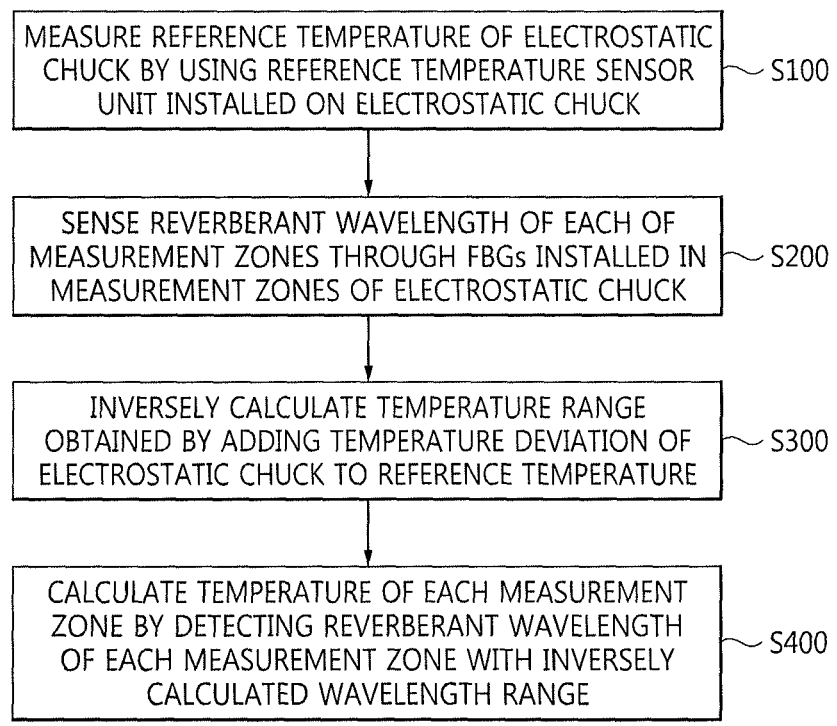
FIG. 7 illustrates an embodiment of a method for measuring temperatures of an electrostatic chuck.

FIG. 7 illustrates an embodiment of a method for measuring the temperature of an electrostatic chuck. The method may include measuring a reference temperature of the electrostatic chuck 20 using the reference temperature sensor unit 30 coupled to the electrostatic chuck 20 that absorbs the substrate W using an electrostatic force (S100), sensing a reverberant wavelength of each measurement zone of the measurement zones 21 divided by a plurality of partition lines in the electrostatic chuck 20 using the measurement zone temperature sensor unit 40 coupled to the electrostatic chuck 20 (S200), setting a measurement range within a temperature range previously determined based on the reference temperature (S300), and calculating temperature of a measurement zone by measuring the reverberant wavelength sensed by the measurement zone temperature sensor unit 40 within the measurement range (S400).

First, the FBG temperature sensor 41 having the FBGs 43 serially connected to an optical fiber is installed in the electrostatic chuck 20. Regarding the FBG temperature sensor 41, relation data of temperature and a reflective signal of the FBGs 43 is provided through calibration.

Next, in the present embodiment, a reference temperature of the electrostatic chuck 20 is measured using the reference temperature sensor unit 30 installed at a predetermined area of the electrostatic chuck 20 (S100). The predetermined area may be a center of the electrostatic chuck or another location on the electrostatic chuck.

Then, reverberant wavelengths of the measurement zones 21 are sensed through the FBGs 43 installed in the measurement zones 21 (S200). For example, when a light source transmits a wavelength of a certain band range to the FBGs 43 serially spaced apart from one another through an optical fiber, each of the FBGs 43 reflects only a previously set particular wavelength and transmits all the other wavelengths.

Each of the FBGs 43 causes deformation of a Bragg grating in response to the temperature of the zone of the measurement zones 21 where the FBG 43 is located. Accordingly, the wavelength reflected from each of the FBGs 43 is shifted by a value corresponding to a deformation rate.

The measurement zone temperature measuring unit 50 measures and calculates the amount of the wavelength shift reflected from each of the FBGs 43 and determines the amount as a temperature of each of the measurement zones 21.

The measurement zone temperature measuring unit 50 may inversely calculate as a wavelength range a temperature range obtained by adding a temperature deviation of the electrostatic chuck 20 to the reference temperature measured by the reference temperature sensor unit 30 (S300). The measurement zone temperature measuring unit 50 may detect a reverberant wavelength of a measurement zone sensed as an inversely calculated wavelength range (e.g., a peak value), so that the temperature of each measurement zone of the measurement zones 21 where each of the FBGs 43 is located is calculated.

According to the above method, even when the FBGs 43 are densely arranged, the temperatures of the measurement zones 21 may be measured and the number of optical fibers to measure the temperature of a measurement zone of the measurement zones 21 of the electrostatic chuck 20 may be reduced. Accordingly, the structure of the electrostatic chuck 20 may be simplified.

The temperature of the measurement zone measured by the measurement zone temperature measuring unit 50 is provided to the main controller 70. The main controller 70 controls the temperature control unit 60 based on the temperature of the measurement zone, so that individual zone temperature control of the electrostatic chuck 20 or the temperature of the substrate W is performed.

The main controller may be implemented in logic which, for example, may include hardware, software, or both. When implemented at least partially in hardware, the BMS may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the main controller may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Figure 8:
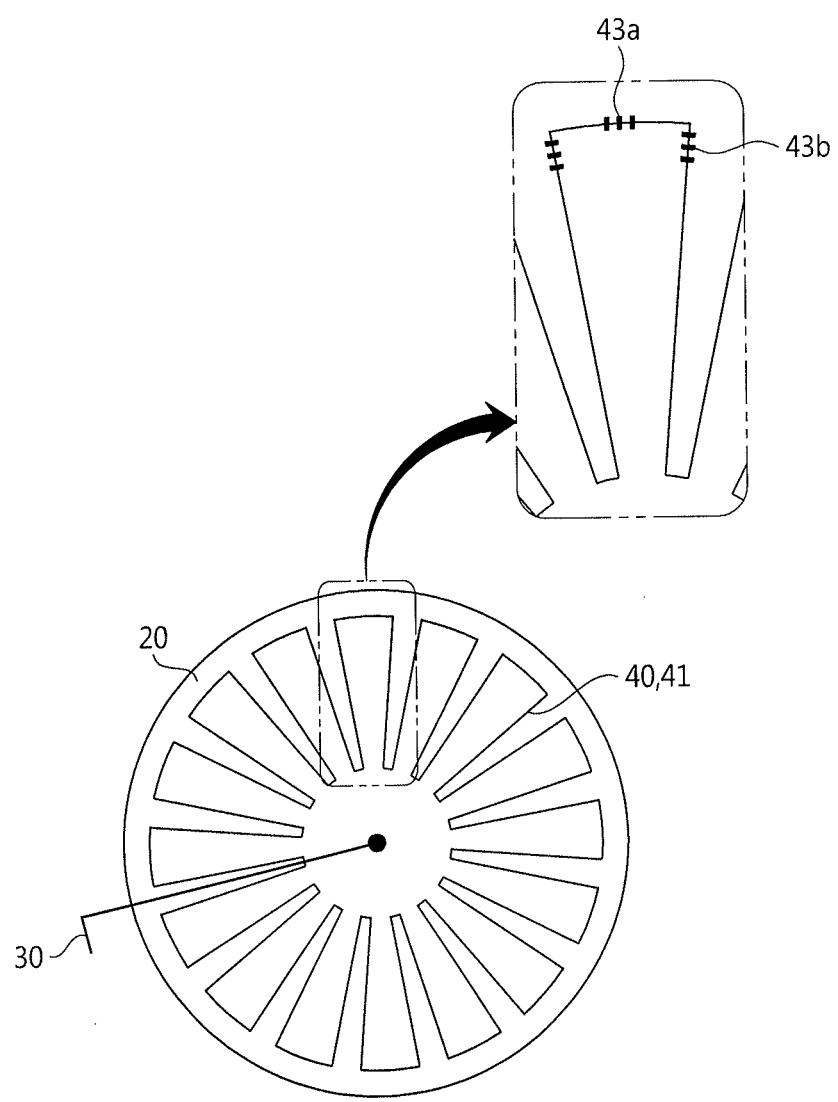
FIG. 8 illustrates another embodiment of an electrostatic chuck.

FIG. 8 illustrates another embodiment of an electrostatic chuck in an electrostatic chuck assembly. The electrostatic chuck assembly of this embodiment has a different plane arrangement of the FBG temperature sensor on the electrostatic chuck, compared to the above-described embodiment.

Referring to FIG. 8, FBGs 43a and 43b are respectively arranged in a circumferential direction and a radial direction. When the FBGs 43a and 43b are installed at very adjacent positions in the circumferential direction and the radial direction, influence of temperature and strain may be separated.

For example, when the FBGs 43a and 43b are installed in the circumferential direction and the radial direction at predetermined adjacent positions of an outer edge of the electrostatic chuck, temperature may be assumed to be almost constant. Also, since the outer edge of the electrostatic chuck is confined, it may be assumed that strain in the circumferential direction does not exist. Accordingly, strain in the radial direction may be checked by analyzing reverberant wavelengths of the FBGs 43a and 43b respectively arranged in the circumferential direction and the radial direction. As the strain in the radial direction is corrected, influence of strain may be separated.

Figure 9:
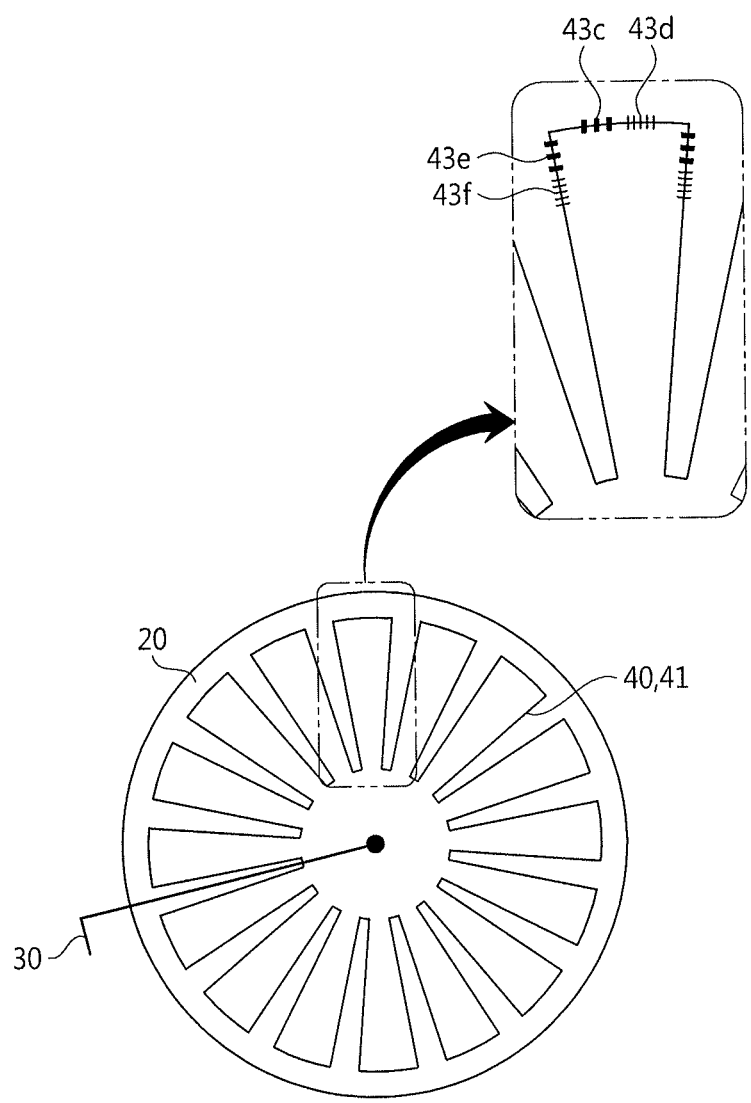
FIG. 9 illustrates another embodiment of an electrostatic chuck.

FIG. 9 illustrates another embodiment of an electrostatic chuck of an electrostatic chuck assembly. This embodiment has a different plane arrangement of the FBG temperature sensor on the electrostatic chuck compared to the above-described embodiment, and has two FBGs with different response characteristics that are arranged adjacent to each other.

Referring FIG. 9, FBGs 43c, 43d, 43e and 43f are respectively arranged in circumferential and radial directions, have different response characteristics, and are arranged adjacent to each. When the reverberant wavelengths of FBGs 43c and 43d and FBGs 43e and 43f, which are arranged in the same direction adjacent to each other, are analyzed, influence of temperature and strain may be separated. In the above-described embodiment, the measurement zone temperature sensor 41 is the FBG temperature sensor 41 including the FBGs 43 placed along the length of an optical fiber. In this embodiment, sensors of different types are used and temperatures at different positions along the length of optical fiber are determined based on parameters of light entering and exiting an optical fiber.

Also, in the above-described embodiment, the measurement zone temperature sensor unit 40 and the measurement zone temperature measuring unit 50 are physically separated from each other. In this embodiment, the measurement zone temperature sensor unit 40 and the measurement zone temperature measuring unit 50 may be implemented as one apparatus, or the measurement zone temperature measuring unit 50 may be physically implemented in the main controller 70.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, the temperature of an electrostatic chuck having a plurality of zones may be efficiently measured. Also, the structure of the electrostatic chuck is less complex than other designs and the temperature distribution of the electrostatic chuck may be measured.

Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. An electrostatic chuck assembly, comprising:
an electrostatic chuck to support a substrate using electrostatic force, the electrostatic chuck including a plurality of measurement zones divided by a plurality of partition lines;
a reference temperature sensor coupled to the electrostatic chuck to measure a reference temperature of the electrostatic chuck;
a measurement zone fiber-optic temperature sensor coupled to the electrostatic chuck and spaced from the reference temperature sensor, the measurement zone fiber-optic temperature sensor to sense measurement zone temperature signals of the measurement zones; and
a measurement zone temperature calculator to calculate a temperature of each of the measurement zones by setting a measurement range within a temperature range previously determined based on the reference temperature measured by the reference temperature sensor, and to measure the measurement zone temperature signal of each of the measurement zones sensed by the measurement zone fiber-optic temperature sensor within the measurement range.

2. The electrostatic chuck assembly as claimed in claim 1, wherein:
the measurement zones are sectioned by a plurality of lines radially arranged from a center of the electrostatic chuck and a plurality of circles spaced apart from one another, a diameter of each of the plurality of circles increasing radially from a center of the electrostatic chuck, and
a number of outer sections is greater than a number of inner sections.

3. The electrostatic chuck assembly as claimed in claim 1, wherein:
the reference temperature sensor is in a central area of the electrostatic chuck and on a plane of the electrostatic chuck spaced apart from the measurement zone temperature sensor, and
the reference temperature sensor includes one of a thermocouple temperature sensor, a resistance temperature detector temperature sensor, or an optical fiber temperature sensor.

4. The electrostatic chuck assembly as claimed in claim 1, wherein the electrostatic chuck includes:
an upper ceramic dielectric layer;
a metal body coupled to the upper ceramic dielectric layer; and
a bonding layer coupling the upper ceramic dielectric layer to the metal body, at least part of the measurement zone temperature sensor at at least one of the upper ceramic dielectric layer or the bonding layer.

5. The electrostatic chuck assembly as claimed in claim 1, wherein the measurement zone fiber-optic temperature sensor is to determine temperatures of different positions along a length of an optical fiber based on parameters of light entering and exiting the optical fiber.

6. The electrostatic chuck assembly as claimed in claim 5, wherein the previously determined temperature range is within a temperature range obtained by adding a previously provided temperature deviation of the electrostatic chuck to the reference temperature.

7. The electrostatic chuck assembly as claimed in claim 6, wherein:
the measurement zone fiber-optic temperature sensor includes a fiber Bragg grating (FBG) temperature sensor, the FBG temperature sensor including a plurality of FBGs along the length of the optical fiber, and
the measurement zone temperature calculator is to calculate the temperature of each of the measurement zones by calculating a wavelength range corresponding to the temperature range obtained by adding the temperature deviation of the electrostatic chuck to the reference temperature and measuring a reverberant wavelength of the measurement zone within the wavelength range.

8. The electrostatic chuck assembly as claimed in claim 7, wherein the FBGs are arranged to respectively correspond to the measurement zones.

9. The electrostatic chuck assembly as claimed in claim 7, wherein the FBGs are arranged in circumferential and radial directions of the electrostatic chuck.

10. A semiconductor manufacturing apparatus, comprising:
a process chamber including a space for a semiconductor manufacturing process; and
an electrostatic chuck assembly to support a substrate using electrostatic force, wherein the electrostatic chuck assembly includes:
an electrostatic chuck to support the substrate using the electrostatic force and including a plurality of measurement zones divided by a plurality of partition lines;
a reference temperature sensor coupled to the electrostatic chuck to measure a reference temperature of the electrostatic chuck;
a measurement zone fiber-optic temperature sensor coupled to the electrostatic chuck and spaced from the reference temperature sensor, the measurement zone fiber-optic temperature sensor to sense measurement zone temperature signals of the measurement zones; and
a measurement zone temperature calculator to calculate a temperature of each of the measurement zones by setting a measurement range within a temperature range previously determined based on the reference temperature measured by the reference temperature sensor and measuring the measurement zone fiber-optic temperature signal sensed by the measurement zone temperature sensor within the measurement range.

11. The apparatus as claimed in claim 10, wherein the measurement zone fiber-optic temperature sensor is to determine temperatures of different positions along a length of an optical fiber based on parameters of light entering and exiting the optical fiber.

12. The apparatus as claimed in claim 11, wherein the previously determined temperature range is within a temperature range obtained by adding a previously provided temperature deviation of the electrostatic chuck to the reference temperature.

13. The apparatus as claimed in claim 12, wherein:
the measurement zone fiber-optic temperature sensor includes a fiber Bragg grating (FBG) temperature sensor, the FBG temperature sensor including a plurality of FBGs along the length of the optical fiber, and
the measurement zone temperature calculator is to calculate the temperature of each of the measurement zones by calculating a wavelength range corresponding to the temperature range obtained by adding the temperature deviation of the electrostatic chuck to the reference temperature and measuring a reverberant wavelength of each of the measurement zones within the wavelength range.

14. A method for measuring temperature of an electrostatic chuck, the method comprising:
measuring a reference temperature of an electrostatic chuck using a reference temperature sensor, the reference temperature sensor coupled to the electrostatic chuck to support a substrate using electrostatic force;
sensing a measurement zone temperature signal of a plurality of measurement zones divided by a plurality of partition lines in the electrostatic chuck, the measurement zone temperature signal sensed using a measurement zone fiber-optic temperature sensor coupled to the electrostatic chuck and spaced from the reference temperature sensor;
setting a measurement range within a temperature range previously determined based on the reference temperature; and
calculating a temperature of each of the measurement zones by setting a measurement range within a temperature range previously determined based on the reference temperature and measuring the measurement zone temperature signal sensed by the measurement zone fiber-optic temperature sensor within the measurement range.

15. The method as claimed in claim 14, wherein:
the measurement zones are sectioned by a plurality of lines radially arranged from a center of the electrostatic chuck and a plurality of circles spaced apart from one another, diameters of the circles increasing radially from the center, and
a number of outer sections is greater than a number of inner sections.

16. The method as claimed in claim 14, wherein the reference temperature sensor is in a central area of the electrostatic chuck and on a plane of the electrostatic chuck spaced from the measurement zone temperature sensor.

17. The method as claimed in claim 14, wherein the measurement zone fiber-optic temperature sensor includes a measurement zone temperature sensor to determine temperatures of different positions along a length of an optical fiber based on parameters of light entering and exiting the optical fiber.

18. The method as claimed in claim 17, wherein the previously determined temperature range is within a temperature range obtained by adding a previously provided temperature deviation of the electrostatic chuck to the reference temperature.

19. The method as claimed in claim 18, wherein:
the measurement zone fiber-optic temperature sensor includes a fiber Bragg grating (FBG) temperature sensor, the FBG temperature sensor including a plurality of FBGs along the length of the optical fiber, and
calculating the temperature of each of the measurement zones includes calculating a wavelength range corresponding to the temperature range obtained by adding the temperature deviation of the electrostatic chuck to the reference temperature and measuring a reverberant wavelength of the measurement zone within the wavelength range.

20. The method as claimed in claim 19, wherein the FBGs are arranged to respectively correspond to the measurement zones.

* * * * *